United States Patent [19]
White

[11] Patent Number: 5,402,126
[45] Date of Patent: Mar. 28, 1995

[54] METHOD AND APPARATUS FOR DIGITAL TO ANALOG CONVERSION USING GAAS HI²L PROCESS-COMPATIBLE VOLTAGE SWITCHING CIRCUITS

[75] Inventor: William A. White, Garland, Tex.

[73] Assignee: Texas Instruments Incorporated, Dallas, Tex.

[21] Appl. No.: 55,606

[22] Filed: Apr. 30, 1993

[51] Int. Cl.⁶ ............................................. H03M 1/78
[52] U.S. Cl. .................................. 341/154; 341/133
[58] Field of Search ...................... 341/133, 144, 154

[56] References Cited

U.S. PATENT DOCUMENTS

| | | | |
|---|---|---|---|
| 4,381,499 | 4/1983 | Struthoff | 341/154 |
| 4,396,907 | 8/1983 | Wintzer et al. | 341/154 |
| 4,491,825 | 1/1985 | Tuthill | 341/154 |
| 4,920,344 | 4/1990 | Henderson et al. | 341/118 |
| 4,942,397 | 7/1990 | Real | 341/118 |
| 4,963,873 | 10/1990 | Tung | 341/153 |
| 5,066,926 | 11/1991 | Ramachandran et al. | 330/311 |
| 5,119,095 | 6/1992 | Asazawa | 341/154 |
| 5,231,396 | 7/1993 | Yagi | 341/154 |
| 5,274,342 | 12/1993 | Wen et al. | 330/295 |

OTHER PUBLICATIONS

G. Van Andrews, et al., "A Monolithic Digital Chirp Synthesizer Chip with I and Q Channels," *IEEE GaAs IC Symposium,* 1991, pp. 19–22.

Van Andrews, et al., "A Monolithic Digital Chirp Synthesizer Chip with I and Q Channels," *IEEE Journal of Solid-State Circuits,* Oct., 1992, pp. 1321–1326.

*Primary Examiner*—Marc S. Hoff
*Attorney, Agent, or Firm*—Carlton H. Hoel; Richard A. Stoltz; Richard L. Donaldson

[57] ABSTRACT

A method and apparatus is provided for accurate digital to analog conversion in which bipolar voltage switches are used in a GaAs I²L integrated circuit. An architecture is provided that includes an R-2R resistor ladder network formed in a GaAs I²L integrated circuit. A compound transistor pair (Q1, Q2) is connected to each leg (2R) of the ladder network in a digital to analog converter (110). Each transistor pair (Q1, Q2) is configured as a single-pole-double-throw voltage bit switch (100). The transistor pair switches the shunt (2R) resistors between two, alternative voltage levels (Vb, circuit "ground"), based on the state of the binary input logic signal (Ai). Each switch and respective leg in the ladder network relates to a corresponding bit position (Ai) in the input signal. A matched pair of diodes (D2, D3) are used to clamp the voltages to be selected by the bit switch (100) to a predetermined voltage level, thus regulating the voltages switched out to the ladder network and increasing the switching speed of the converter.

11 Claims, 2 Drawing Sheets

METHOD AND APPARATUS FOR DIGITAL TO ANALOG CONVERSION USING GAAS HI²L PROCESS-COMPATIBLE VOLTAGE SWITCHING CIRCUITS

TECHNICAL FIELD OF THE INVENTION

This invention relates generally to electronic circuits, and more particularly, to a method and apparatus for digital to analog conversion using GaAs HI²L process-compatible voltage switching circuits.

BACKGROUND OF THE INVENTION

In digital to analog converters ("DACs"), various types of devices including field effect transistors ("FETs"), bipolar junction transistors ("BJTs") and heterojunction bipolar transistors ("HBTs") may be configured in differential pairs as current switching devices. Typically, the transistor pair operating as a single-pole-double-throw switch directs current flow from one of two, alternative paths to a precision current source depending on the logic state of an incoming binary signal (i.e., "high" or "low" state). The output of a plurality of such switches is an analog signal that represents the input binary logic signal. Typically, the number of switches used in a DAC corresponds to the number of bits to be converted to an analog signal. For example, eight bit switches (transistor-pairs plus precision current sources) may be used to convert an eight bit, binary input signal to an analog output signal.

In manufacturing integrated circuit DACs, current or voltage switches may be fabricated by forming them as HBT devices in a heterogeneous integrated-injection logic ("HI²L") gate structure. Since the structure of the HBT devices is compatible with the HI²L gate structure, the bipolar transistors may be readily formed on the HI²L integrated circuit chip during the fabrication process.

In an integrated circuit DAC manufacturing process, bipolar transistors configured as current or voltage switches may be formed in a Gallium Arsenide ("GaAs") HI²L gate structure. In such a structure, the switching transistors are formed with all of their emitters in common and connected to the conducting substrate. Consequently, this circuit requires only one power bus, which makes it one of the densest among the GaAs circuit technologies. However, since the switching transistors' emitters are formed in common on a single substrate, each individual emitter is inaccessible. Therefore, without access to each emitter, differential pairs cannot be constructed and accurate (i.e., reduced error) current mode switching is difficult to implement in a GaAs I²L integrated circuit.

SUMMARY OF THE INVENTION

Accordingly, a need exists in the integrated circuit manufacturing industry for accurate digital to analog conversion using I²2L process-compatible bit switches. In accordance with the present invention, a method and apparatus is provided for accurate digital to analog conversion in which voltage switching is used in a GaAs I²L integrated circuit. In particular, a digital to analog converter and method of conversion is provided that includes an R-2R resistor ladder network formed in a GaAs I²L integrated circuit. One of a pair of bipolar transistors is connected to each leg of the ladder network. Each transistor pair is configured as a single-pole-double-throw voltage bit switch. The transistor pair switches the shunt (2R) resistors between two, alternative voltage levels, based on the logic state of the binary input signal (i.e., "high" or "low" state). Each switch and respective leg in the ladder network relates to a corresponding bit position in the input signal.

An important technical advantage of the present invention is that accurate switching may be accomplished in a digital to analog converter using the dense GaAs I²L technology. Another important technical advantage of the present invention is that the voltage switching is accomplished at a high rate. Consequently, the present digital to analog converter is a much higher speed device than current switched devices.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1-5 of the drawings, like numerals being used for like and corresponding parts of the various drawings.

Figure 1:
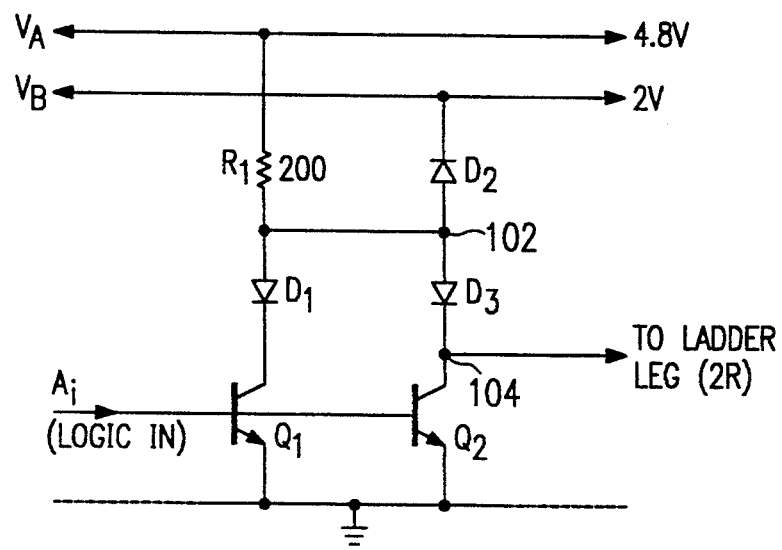
FIG. 1 illustrates an electrical schematic circuit diagram of a preferred embodiment of a single-pole-double-throw voltage bit switch according to the teachings of the present invention.

FIG. 1 illustrates an electrical schematic circuit diagram of a preferred embodiment of a single-pole-double-throw voltage bit switch according to the teachings of the present invention. As described in more detail below with respect to FIG. 3, a digital to analog converter according to the present invention includes a plurality of single-pole-double-throw bit switches such as the switch shown in FIG. 1. For the purposes of this discussion, only the bit switch of FIG. 1 will be described in detail, since its structure and operation are identical to those of each of the other bit switches shown in FIG. 3. Also, it should be understood that the component values shown in FIG. 1 are for illustrative purposes only and not intended as limitations to be placed on the present invention. The bases of transistors Q1 and Q2 are connected together in a compound switching configuration. The emitters of Q1 an Q2 are common and connected to circuit "ground". In actuality, for design purposes, circuit "ground" may be at a voltage level other than zero volts. The cathode of diode D1 is connected to the collector of Q1, and the anode of D1 is connected to one terminal of resistor R1 and also node 102. The opposite terminal of R1 is connected to voltage supply Va. The anodes of diodes D2 and D3 are connected together and also to node 102. The cathode of diode D3 is connected to the collector of Q2 and also node 104, while the cathode of diode D2 is connected to voltage supply Vb. Diodes D2 and D3 are used to clamp the voltage at nodes 102 and 104 to predetermined values when transistors Q1 and Q2 are off. Consequently, as described in more detail below, an attempt is made to match diode D2 as closely as possible to diode D3 in order to minimize circuit errors. The logic input signal Ai is connected to the bases of both transistors Q1 and Q2. Node 104 is connected to a respective shunt (2R) resistor on the ladder network of the present invention, which will be described in detail below with respect to FIG. 3.

Figure 2:
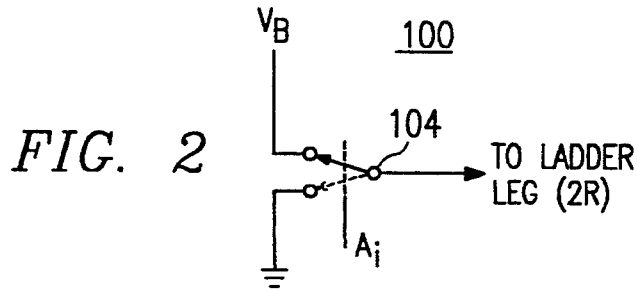
FIG. 2 illustrates an equivalent electrical circuit for the single-pole-double-throw voltage bit switch circuit of FIG. 1.

FIG. 2 illustrates an equivalent electrical circuit for the single-pole-double-throw voltage bit switch circuit of FIG. 1. As will be described in detail below, depending on the logic state (i.e., "high" or "low") of input signal Ai, voltage switch 100 selects between either power supply voltage Vb (input logic state "low") or ground potential (input logic state "high"). It is understood that switch 100 operates essentially as a single-pole-double-throw switch which selects between the contact connected to Vb and the contact connected to circuit ground (conducting substrate of FIG. 1), under the control of logic input signal Ai. The voltage potential selected by switch 100 is coupled to a respective shunt resistor (2R) in the ladder network of the DAC shown in FIG. 3.

Figure 3:
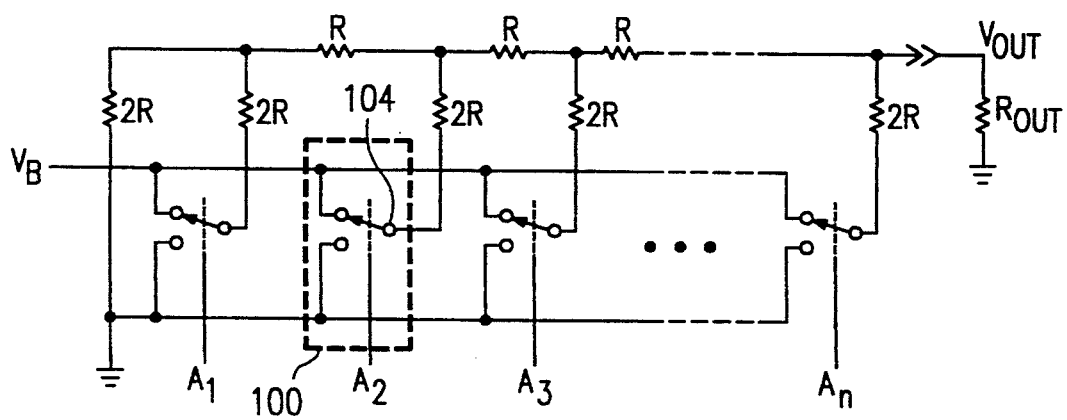
FIG. 3 illustrates an electrical schematic circuit diagram of a digital to analog converter including an R-2R ladder network and a plurality of voltage bit switches according to the teachings of the present invention.

FIG. 3 illustrates an electrical schematic circuit diagram of a digital to analog converter including an R-2R ladder network and a plurality of voltage bit switches according to the teachings of the present invention. For the purpose of this discussion, voltage bit switch 100 of FIG. 2 is shown with respect to bit position 2 in the ladder network of FIG. 3, although the present invention is not intended to be so limited. It is understood that the structure and operation of bit switch 100 is identical to that of each of the other bit switches shown in FIG. 3, and consequently, the description herein of bit switch 100 applies equally to each of the other bit switches shown in FIG. 3. The DAC shown in FIG. 3 is based on an R-2R ladder network having an output voltage (Vout) in which each voltage switch in the network provides a binary weighted contribution to the total voltage developed at the output.

Figure 4:
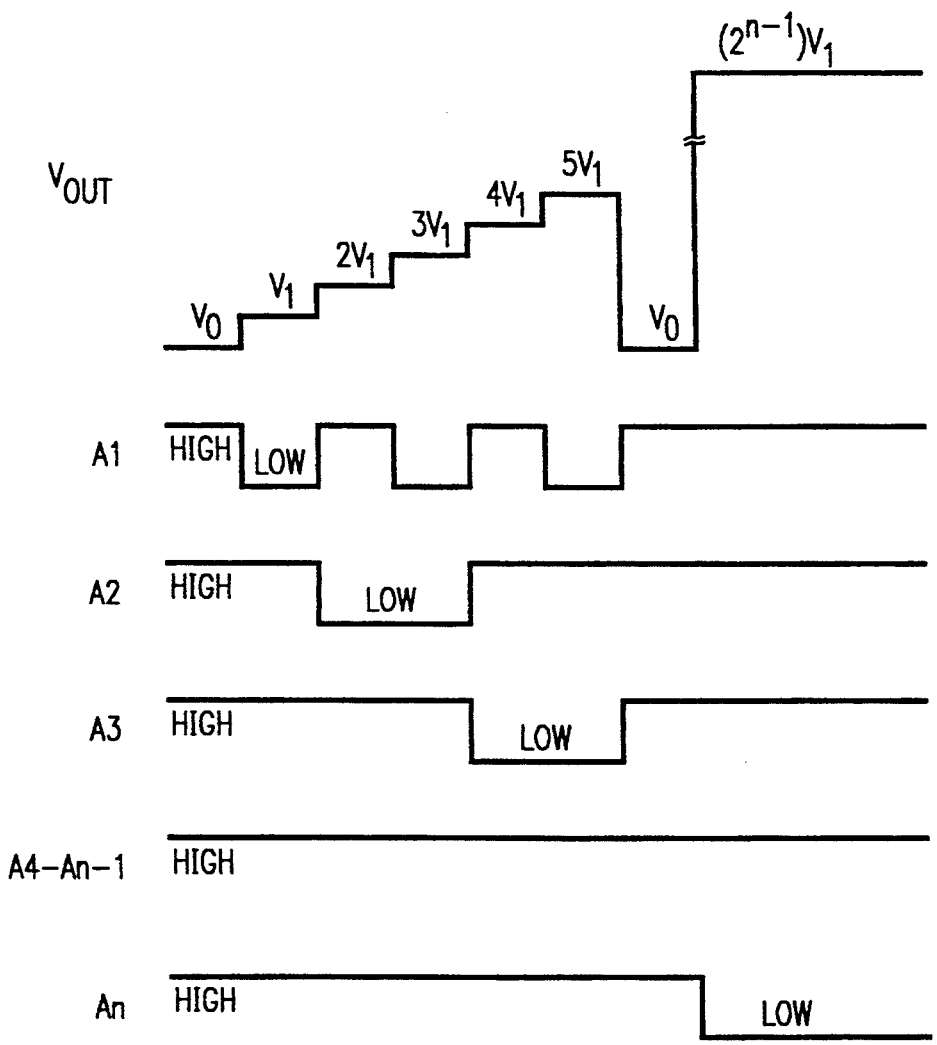
FIG. 4 illustrates a representative output analog voltage from the digital to analog converter shown in FIG. 3.

FIG. 4 illustrates a representative output voltage (Vout) from the DAC shown in FIG. 3. As shown, each bit switch A1-An contributes a binary weighted voltage to the total voltage developed at the output (Vout) of the ladder network in the DAC shown in FIG. 3. Consequently, according to the teachings of the present invention, the digital logic input signal Ai is converted to a corresponding analog signal Vout in the DAC of FIG. 3.

Figure 5:
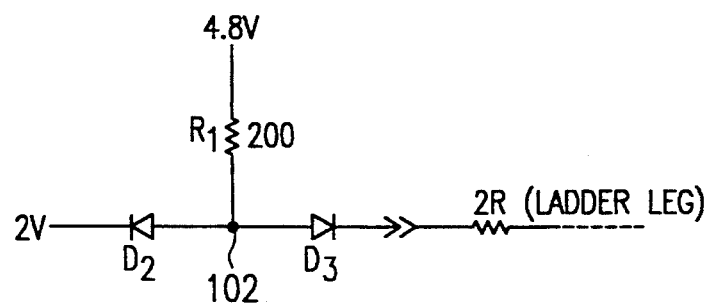
FIG. 5 illustrates an electrical equivalent circuit for a "low" input logic signal for the single-pole-double-throw voltage bit switch of FIGS. 1 and 2.

FIG. 5 illustrates an equivalent electrical circuit for a "low" input logic signal state for the single-pole-double-throw voltage bit switch of FIGS. 1 and 2. The dashed line in FIG. 2 between node 104 and the contact connected to ground represents the alternative switch position for a "high" input logic signal state.

Referring to FIG. 1 for the operation of a voltage bit switch according to the present invention, when binary logic input signal Ai is at a "low" state, transistors Q1 and Q2 are biased into cutoff (turned off). FIGS. 2 and 5 illustrate the equivalent electrical schematic circuit of the single-pole-double-throw bit switch of FIG. 1 when logic input signal Ai is "low" and Q1 and Q2 are cutoff since diodes D2 and D3 are formed as closely matched diodes, even with large variations in diode currents, the voltage drops across D2 and D3 are nearly equal. Of course, as a practical matter, since D2 and D3 are not "ideal" diodes, their voltage drops may not be identical but the diodes may be matched so that the voltage drop difference is very small. So, for the purposes of this discussion, the voltage drops developed across D2 and D3 are considered to be equal with respect to FIG. 5. Diode D2 operates to clamp the voltage at node 102 to one diode voltage drop greater than the voltage level of Vb. Since diodes D2 and D3 are "matched," the voltage present at the cathode of D2 (2v) is virtually identical to the voltage developed at the cathode of D3. Therefore, when logic input signal Ai is at a "low" state, the voltage Vb is selected by bit switch 100 as shown in FIGS. 2 and 3 and output to a respective shunt (2R) resistor in the ladder network. By using "matched" diodes D2 and D3, the voltage at node 104 is clamped to the voltage Vb and the output from voltage bit switch 100 is regulated.

Conversely, referring again to FIG. 1, when binary logic input signal Ai is at a "high" state, transistors Q1 and Q2 conduct into saturation and provide a very low resistance path from each collector to ground. The current flowing through R1 then causes a voltage drop across R1. The resulting voltage at node 102 reverse biases diode D2 into cutoff so that all of the current flowing in resistor R1 flows to ground through diode D1 and transistor Q1, and diode D3 and transistor Q2. Current flow through Q2 is partly from the ladder network and partly from D3. Current variations in Q2 are smoothed by components Q1, D1 and D3. When the current in the corresponding ladder leg is large (e.g., Vb connected to all other ladder legs), the voltage at node 104 will increase because of the higher current in Q2. This will decrease the forward voltage across D3 thus reducing its current and causing most of the current from R1 to flow through D1 and Q1. When the current in the corresponding ladder leg is small (e.g., ground connected to all other legs) the voltage at node 104 decreases. The resulting increase in the forward voltage across D3 diverts current from D1, Q1 to D3, Q2. This regulating action greatly reduces current variations in Q2 compared with those of a switch that does not include diode D1 and transistor Q1. Transistor Q2 presents a very low resistance path from its collector to ground. The low resistance and reduced current variation combine to keep the voltage developed across Q2 at node 104 virtually constant at the circuit's ground potential. Therefore, referring now to FIG. 2 for a "high" input logic signal, voltage bit switch 100 selects the contact connected to the circuit's "ground" potential (dashed line) and outputs that (regulated) voltage to its respective shunt (2R) resistor in the ladder network of FIG. 3.

An advantage of the present invention in operating Q2 very close to "ground" potential and reducing Q2's current variations is that the bit switch is less susceptible to variations at the output or load side of the circuit. Also, the voltage switching approach requires no precision current sources which, in this common emitter technology, cannot be isolated from the switching voltages present in a current switched DAC. These rapidly changing voltages which steer the current from alternate paths, induce slowly decaying transients in the precision currents. Consequently, the voltage bit switched DAC according to the teachings of the present invention, is a significantly faster device than a current switched DAC. Another advantage of the present invention is that by using D2 and D3 to regulate the output voltages from the bit switch, operating errors caused by such conditions as overtemperature, etc. are compensated for.

On the other hand, and as a practical matter, voltage bit switching for use in a DAC may be used primarily with an R-2R ladder network architecture. So, while the present invention is not intended to be limited for use only in an R-2R network DAC, it may be practically limited in that regard. Also, from another practical standpoint, the voltage switched DAC has a resolution of about eight bits. Since diodes D2 and D3 are not "ideal" or perfectly matched, unequal forward voltages may be developed across both diodes that create a source of output voltage error. In other words, as the output load varies, there may be more or less current flowing through D3 than D2. The current increase in one diode may be accompanied by a decrease in current flow in the other diode causing an increase in voltage across one diode and a decrease in voltage across the other. The logarithmic dependence of diode voltage on diode current keeps voltage variations small, but these small differences in the variations add in the direction of increased error. For example, if the current in one diode increases by a factor of 2 while the current in the other diode decreases by a factor of 2, a voltage error between the two diodes of up to 40 mv may be developed. This error becomes more significant in a DAC as more bit switches are used in the ladder network. The resulting error at the output of the DAC may be unacceptable if more than eight voltage bit switches are used in an R-2R ladder network.

Although the present invention and its advantages have been described in detail, it should be understood that various changes, substitutions and alterations can be made herein without departing from the spirit and scope of the invention as defined by the appended claims.

What is claimed is:

1. A voltage switching circuit comprising:

A first transistor and a second transistor, the emitters of said transistors electrically connected and the bases of said transistors electrically connected;

first, second and third diodes, the anodes of said diodes electrically connected, the cathode of said first diode electrically connected to said collector of said first transistor, the cathode of said second diode electrically connected to said collector of said second transistor, and the cathode of said third diode maintained at a first bias voltage; and a resistor with first terminal electrically connected to said anode of said diodes and second terminal maintained at a second bias voltage whereby the output voltage at said collector of said second transistor is determined by a logic signal input applied to said bases of said transistors.

2. The circuit of claim 1, wherein said first bias voltage is 2 volts, said second bias voltage is 4.8 Volts, and said resistor is 200 ohms.

3. The circuit of claim 1, wherein said transistors are heterojunction bipolar transistors.

4. The circuit of claim 1, wherein said output voltage is equal to said first bias voltage when said logic signal input is low.

5. The circuit of claim 1, wherein said output voltage is equal to ground potential when said logic signal input is high.

6. A digital to analog converter fabricated on a semiconductor substrate, said converter comprising:

an N-segment electrical network; and one or more voltage switching circuits comprising two transistors with emitters connected in common to said substrate, said switching circuits operable to apply one of a plurality of predetermined voltages to said network based on an input signal applied to said switching circuits.

7. The converter of claim 6, wherein said N-segment electrical network comprises an R-2R resistive network.

8. The converter of claim 6, wherein said transistors are heterojunction bipolar transistors.

9. The converter of claim 6, wherein each of said voltage switching circuits applies one of two predetermined voltages to said N-segment electrical network in response to a binary input voltage.

10. The converter of claim 6, wherein said voltage switching circuit comprises:

A first transistor and a second transistor, the emitters of said transistors electrically connected and the bases of said transistors electrically connected;

first, second and third diodes, the anodes of said diodes electrically connected, the cathode of said first diode electrically connected to said collector of said first transistor, the cathode of said second diode electrically connected to said collector of said second transistor, and the cathode of said third diode maintained at a first bias voltage; and a resistor with first terminal electrically connected to said anode of said diodes and second terminal maintained at a second bias voltage.

11. The converter of claim 10, wherein said electrical network is an R-2R resistive network.

* * * * *